United States Patent
Xie et al.

(10) Patent No.: US 12,167,556 B2
(45) Date of Patent: Dec. 10, 2024

(54) FOLDABLE DISPLAY PANEL, MANUFACTURE METHOD THEREOF AND FOLDABLE DISPLAY DEVICE

(71) Applicants: Chengdu BOE Optoelectronics Technology Co., Ltd., Chengdu (CN); BOE Technology Group Co., Ltd., Beijing (CN)

(72) Inventors: Zhihao Xie, Beijing (CN); Binfeng Feng, Beijing (CN); Fei Li, Beijing (CN)

(73) Assignees: Beijing BOE Technology Development Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 640 days.

(21) Appl. No.: 17/285,975

(22) PCT Filed: Jul. 28, 2020

(86) PCT No.: PCT/CN2020/105293
§ 371 (c)(1),
(2) Date: Apr. 16, 2021

(87) PCT Pub. No.: WO2022/021095
PCT Pub. Date: Feb. 3, 2022

(65) Prior Publication Data
US 2022/0304174 A1  Sep. 22, 2022

(51) Int. Cl.
*H05K 5/03* (2006.01)
*H05K 5/00* (2006.01)

(52) U.S. Cl.
CPC ............. *H05K 5/03* (2013.01); *H05K 5/0017* (2013.01); *C09K 2323/033* (2020.08)

(58) Field of Classification Search
None
See application file for complete search history.

(56) References Cited

U.S. PATENT DOCUMENTS

2018/0217639 A1*  8/2018  Jones .................... G06F 1/1626
2019/0011954 A1*  1/2019  Chu ........................ B32B 17/10
(Continued)

FOREIGN PATENT DOCUMENTS

| CN | 106154675 A | 11/2016 |
|---|---|---|
| CN | 106886253 A | 6/2017 |

(Continued)

OTHER PUBLICATIONS

Office Action received for Chinese Patent Application No. 202080001380.4, mailed on Jun. 19, 2024, 18 pages (7 pages of English Translation and 11 pages of Original Document).

*Primary Examiner* — Eli D. Strah
(74) *Attorney, Agent, or Firm* — ArentFox Schiff LLP; Michael Fainberg

(57) ABSTRACT

The present disclosure can provide a foldable display panel, a manufacture method thereof and a foldable display device. The foldable display panel includes a display module, where the display module includes a first foldable part, and first flat parts located on two sides of the first foldable part; and an ultrathin glass cover window which is located on the side of a light emitting surface of the display module, where the ultrathin glass cover window includes a second foldable part, and second flat parts located on two sides of the second foldable part; and an orthographic projection of the second foldable part on the display module covers the first foldable part, and orthographic projections of the second flat parts on the display module cover the first flat parts.

17 Claims, 2 Drawing Sheets

(56) References Cited

U.S. PATENT DOCUMENTS

| | | | |
|---|---|---|---|
| 2020/0064886 A1* | 2/2020 | Cho | G06F 1/1652 |
| 2020/0150726 A1 | 5/2020 | Jones et al. | |
| 2021/0034115 A1* | 2/2021 | Pichumani | G06F 1/1637 |
| 2021/0057669 A1* | 2/2021 | Choi | G06F 1/1637 |
| 2022/0118744 A1* | 4/2022 | Ouyang | B32B 7/12 |

FOREIGN PATENT DOCUMENTS

| | | |
|---|---|---|
| CN | 109246963 A | 1/2019 |
| CN | 110164315 A | 8/2019 |
| CN | 110858461 A | 3/2020 |
| JP | 2019119084 A | 7/2019 |
| KR | 20180079093 A | 7/2018 |

* cited by examiner

FOLDABLE DISPLAY PANEL, MANUFACTURE METHOD THEREOF AND FOLDABLE DISPLAY DEVICE

CROSS REFERENCE TO RELATED APPLICATIONS

This application is a national phase entry under 35 U.S.C. § 371 of International Application No. PCT/CN2020/105293, filed on Jul. 28, 2020, the entire content of which is incorporated herein by reference.

FIELD

The present disclosure relates to the field of display, particularly to a foldable display panel, a manufacture method thereof and a foldable display device.

BACKGROUND

With continuous development of display technologies, display terminals such as mobile phones have been given more and more diversified functions. In particular, because of flexibility of flexible display screens mounted on foldable display terminals, users can fold or unfold these terminals, which have become a development trend of display terminals. Specifically, when a foldable display terminal is folded, it can be carried by a user easily because of the small area; and when the foldable display terminal is unfolded, the display area is large and visual experience effects are better.

SUMMARY

In one aspect, an embodiment of the present disclosure provides a foldable display panel, including: a display module, where the display module includes: a first foldable part, and first flat parts located on two sides of the first foldable part; and an ultrathin glass cover window located on a side of a light emitting surface of the display module, where the ultrathin glass cover window includes: a second foldable part, and second flat parts located on two sides of the second foldable part; and an orthographic projection of the second foldable part on the display module covers the first foldable part, and orthographic projections of the second flat parts on the display module cover the first flat parts.

In one embodiment, according to the foldable display panel provided by the embodiment of the present disclosure, an edge of the display module and an edge of the ultrathin glass cover window are bent towards a side facing away from the light emitting surface of the display module.

In one embodiment, according to the foldable display panel provided by the embodiment of the present disclosure, an arc length of the edge, bent to the side facing away from the light emitting surface of the display module, of the ultrathin glass cover window is a first arc length, an arc length of the edge, bent to the side facing away from the light emitting surface of the display module, of the display module is a second arc length, and the first arc length is larger than the second arc length.

In one embodiment, according to the foldable display panel provided by the embodiment of the present disclosure, elasticity modulus of the bent edge of the ultrathin glass cover window is larger than elasticity modulus of the second foldable part and elasticity modulus of the second flat parts.

In one embodiment, according to the foldable display panel provided by the embodiment of the present disclosure, the elasticity modulus of the bent edge of the ultrathin glass cover window is larger than or equal to 70 Gpa and smaller than or equal to 75 Gpa.

In one embodiment, according to the foldable display panel provided by the embodiment of the present disclosure, a hardness value of the bent edge of the ultrathin glass cover window is larger than or equal to 7 H.

In one embodiment, according to the foldable display panel provided by the embodiment of the present disclosure, in a direction perpendicular to the light emitting surface of the display module, a thickness of the second foldable part, a thickness of the second flat parts and a thickness of the bent edge of the ultrathin glass cover window are equal.

In one embodiment, according to the foldable display panel provided by the embodiment of the present disclosure, in the direction perpendicular to the light emitting surface of the display module, a thickness of the ultrathin glass cover window ranges from 30 µm to 70 µm.

In one embodiment, according to the foldable display panel provided by the embodiment of the present disclosure, a reinforcement depth of the ultrathin glass cover window is larger than or equal to 6 µm, and reinforcement compressive stress is larger than or equal to 450 MPa.

In one embodiment, according to the foldable display panel provided by the embodiment of the present disclosure, a radian of the bent edge of the display module is larger than 0° and smaller than 90°, or equal to 90°.

In one embodiment, according to the foldable display panel provided by the embodiment of the present disclosure, under a bent state, radians of the first foldable part and the second foldable part are larger than 0° and smaller than 180°, or equal to 180°.

In one embodiment, the foldable display panel provided by the embodiment of the present disclosure further includes a bracket located on a side, facing away from the ultrathin glass cover window, of the display module, wherein a shape of the bracket is consistent with a shape of the display module.

In one embodiment, according to the foldable display panel provided by the embodiment of the present disclosure, an orthographic projection of the bracket on the light emitting surface of the display module completely covers the display module.

In one embodiment, according to the foldable display panel provided by the embodiment of the present disclosure, the orthographic projection of the bracket on the light emitting surface of the display module is outwards expanded by at least 0.2 mm and at most 0.5 mm relative to the display module.

In another aspect, an embodiment of the present disclosure further provides a foldable display device, including: a shell, a foldable display panel fixed on the shell, and a rotation shaft in hinged connection with the shell, where the foldable display panel is the above-mentioned foldable display panel; and the rotation shaft is configured to drive the shell and the foldable display panel to get bent or unfolded together.

In one embodiment, according to the foldable display device provided by the embodiment of the present disclosure, the shell includes: a first shell body and a second shell body, and the first shell body and the second shell body are in rotatable connection by the rotation shaft.

In one embodiment, according to the foldable display device provided by the embodiment of the present disclosure, a first foldable part corresponds to an area between the first shell body and the second shell body, and first flat parts and the bend edges on two sides of the first foldable part are accommodated by the first shell body and the second shell body respectively.

In one embodiment, according to the foldable display device provided by the embodiment of the present disclosure, an orthographic projection of the rotation shaft on the light emitting surface of the display module coincides with a bending axis of the first foldable part.

In one embodiment, the foldable display device provided by the embodiment of the present disclosure further includes: a binding layer between the shell and an end face of the bent edge of the display module.

In another aspect, an embodiment of the present disclosure further provides a manufacture method of the foldable display panel, including:
  manufacturing a display module, where the display module includes: a first foldable part, and first flat parts located on two sides of the first foldable part;
  manufacturing an ultrathin glass cover window, where the ultrathin glass cover window includes: a second foldable part, and second flat parts located on two sides of the second foldable part; and
  fitting a side of a light emitting surface of the display module to the ultrathin glass cover window, so that an orthographic projection of the second foldable part on the display module covers the first foldable part, and orthographic projections of the second flat parts on the display module cover the first flat parts.

In one embodiment according to the manufacture method provided by the embodiment of the present disclosure, manufacturing the ultrathin glass cover window includes:
  providing planar glass with a thickness of 30 µm to 70 µm; and
  heating the planar glass under a temperature of 580° C. to 710° C., and softening the planar glass for shaping in a mold and annealing the planar glass to obtain the ultrathin glass cover window with a bent edge, where the ultrathin glass cover window further includes a second foldable part, and second flat parts each located between the second foldable part and the bent edge.

In one embodiment, according to the manufacture method provided by the embodiment of the present disclosure, after the side of the light emitting surface of the display module is fitted to the ultrathin glass cover window, the method further includes:
  providing a steel sheet with a thickness larger than or equal to 0.1 mm;
  etching the steel sheet, so that a shape of the etched steel sheet is similar to a shape of the planar glass;
  stamping and forming for an edge of the etched steel sheet so as to form a bracket with a bent edge, wherein a curvature of the bent edge of the bracket is similar to a curvature of the bent edge of the ultrathin glass cover window; and
  fitting the bracket to a side, facing away from the ultrathin glass cover window, of the display module, where the bracket completely covers the display module.

DETAILED DESCRIPTION OF THE EMBODIMENTS

In order to make objectives, technical solutions and advantages of the embodiments of the present disclosure clearer, the technical solutions of the embodiments of the present disclosure will be described clearly and completely below in combination with the accompanying drawings of the embodiments of the present disclosure. It is notable that sizes and shapes of all figures in the accompanying drawings do not reflect the true scale and are only used for illustrating contents of the present disclosure. Same or similar labels throughout denote the same or similar components or those with same or similar functions. Obviously, embodiments described are only part of the embodiments of the present disclosure, rather than all the embodiments. Based on the described embodiments of the present disclosure, all the other embodiments acquired by those of ordinary skill in the art without making creative labor fall into claims of the present disclosure.

Unless otherwise defined, technical terms or scientific terms used here should be of general meanings understood by those of ordinary skill in the art of the present disclosure. "First", "second" and similar words used in the specifications and claims do not denote any sequence, quantity or importance, and are only used to distinguish different constituents. The word "include" or "contain" and other similar words denote that components or objects appearing before the word contain components or objects and their equivalents appearing after the word, without excluding other components or objects. Words like "inside", "outside", "on" and "under" are only used to represent relative position relations. When an absolute position of the described object is changed, the relative position relation may be changed correspondingly.

As for existing foldable display terminals in the market, a cover window of a display module is made of flexible materials such as polyimide (PI) and polyethylene terephthalate (PET). Due to high flexibility and insufficient rigidity of PI, creases can easily appear in a folded area when the foldable display terminal is unfolded from a folded state.

Figure 1:
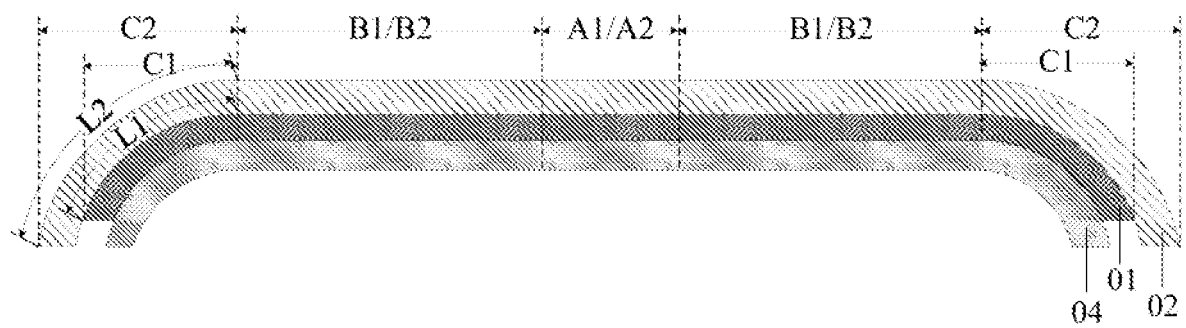
FIG. 1 is a schematic structural diagram of a foldable display panel according to the embodiments of the present disclosure.

Aiming at above problems in the related art, an embodiment of the present disclosure provides a foldable display panel, as shown in FIG. 1, including:
  a display module 01, where the display module 01 includes: a first foldable part A1, and first flat parts B1 located on two sides of the first foldable part A1; and
  an ultrathin glass cover window 02 located on the side of a light emitting surface of the display module 01, where the ultrathin glass cover window 02 includes: a second foldable part A2, and second flat parts B2 located on two sides of the second foldable part A2; and an orthographic projection of the second foldable part A2 on the display module 01 covers the first foldable part A1, and orthographic projections of the second flat parts B2 on the display module 01 cover the first flat parts B1.

In the foldable display panel provided by the embodiment of the present disclosure, the ultrathin glass cover window 02 is configured to protect the display module 01. The ultrathin glass cover window 02 not only has a rigid characteristic of a glass material, but also has a certain bending property, so that the foldable display panel has high bending performance and enough hardness. Therefore, creasing caused by folding is relieved to the maximum extent.

Figure 2:
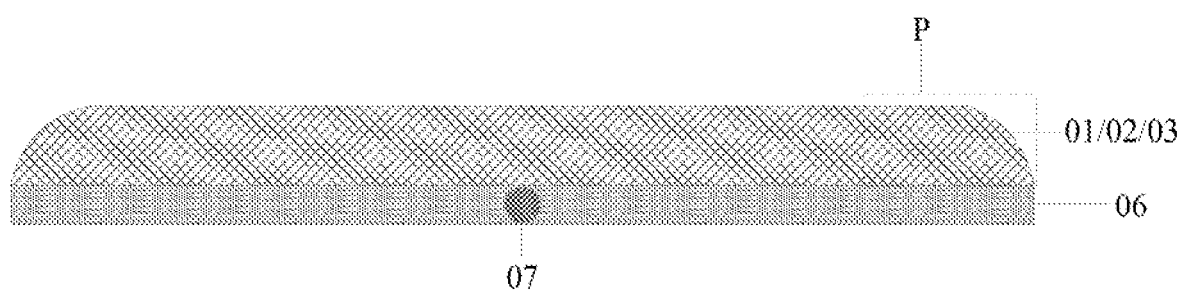
FIG. 2 is a schematic structural diagram of a foldable display device according to the embodiments of the present disclosure.
Figure 3:
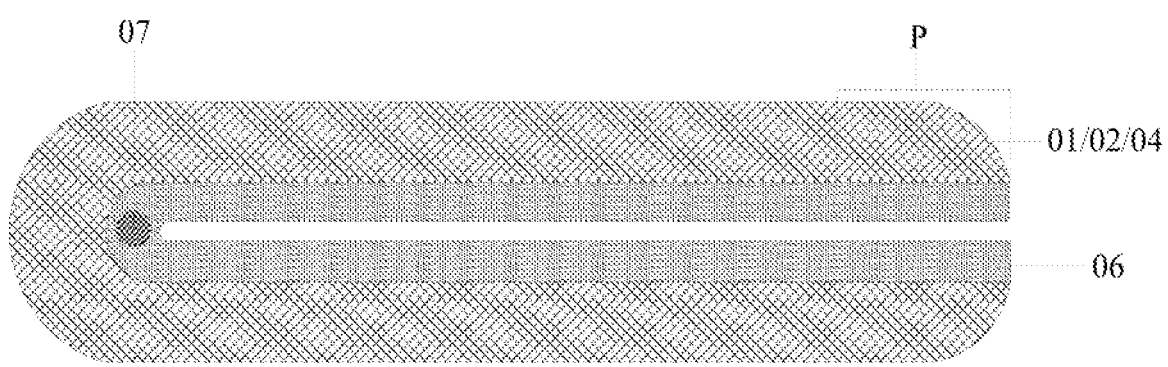
FIG. 3 is another schematic structural diagram of the foldable display device according to the embodiments of the present disclosure.

In one embodiment, in an unfolded state, the first foldable part A1 and the first flat parts B1 of the display module 01 are located on the same plane. Correspondingly, the second foldable part A2 and the second flat parts B2 of the ultrathin glass cover window 02 are also located on the same plane, as shown in FIG. 2. In a bent state, the radian of the first foldable part A1 is larger than 0° and smaller than 180°, or equal to 180°; and correspondingly, the radian of the second foldable part A2 is larger than 0° and smaller than 180°, or equal to 180°. As an example, FIG. 3 shows that the bending radian of the first foldable part A1 and the second foldable part A2 is 180°.

Figure 4:
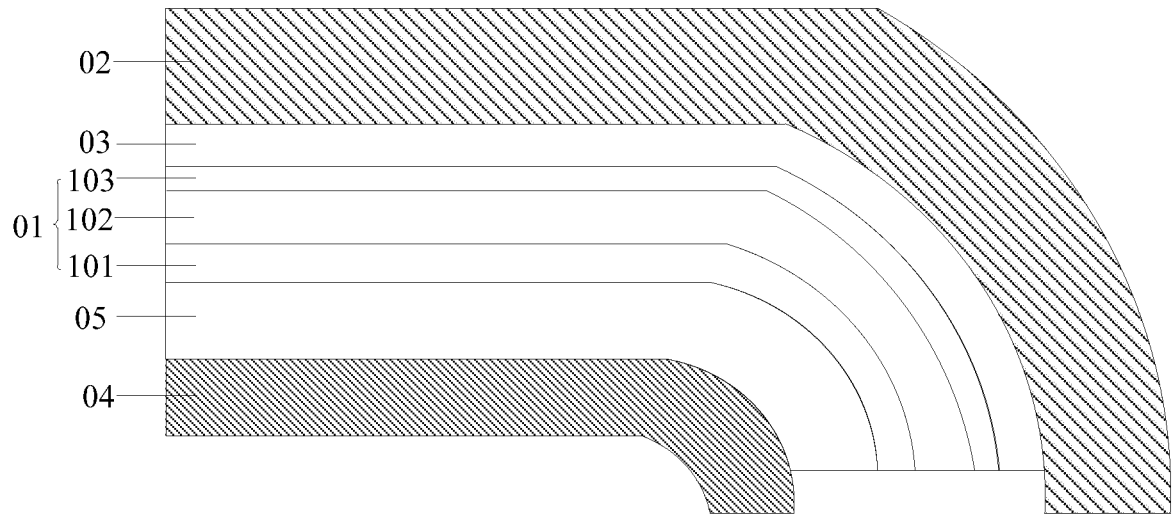
FIG. 4 is a schematic diagram of an amplified structure of an area P in FIG. 2 and FIG. 3.

The display module 01 may be a flexible organic light emitting display panel and specifically may be an Organic Light Emitting Display (OLED) flexible display panel. The display module 01 may be other screen bodies which are flexible and bendable, such as a Micro LED flexible display panel, a Quantum Dot (QD) light emitting flexible display panel, etc., which will not be defined here. In addition, as shown in FIG. 4, the display module 01 and the ultrathin glass cover window 02 can be fixed by a first binding layer 03, such as an Optically Clear Adhesive (OCA) layer or a Thermoplastic Urethane (TPU) adhesive layer, or they can be adhered through electrostatic adsorption, which will not be defined here. In some embodiments, as shown in FIG. 4, the display module 01 may include a driving back plate 101, a light emitting device layer 102 electrically connected to the driving back plate 101 and a polarizer 103. The light emitting device layer 102 includes multiple light emitting devices, and each light emitting device includes but is not limited to an anode and a cathode as well as a light emitting functional layer located between the anode and the cathode.

Optionally, according to the foldable display panel provided by the embodiment of the present disclosure, as shown in FIG. 1, edges C1 of the display module 01 and edges C2 of the ultrathin glass cover window 02 are bent towards the side facing away from a light emitting surface of the display module 01 so as to form a bent arc face and enhance appearance aesthetics of the foldable display panel and ductility of a displayed picture. In some embodiments, the radian of the bent edge C1 of the display module 01 is larger than 0° and smaller than 90°, or equal to 90°.

In one embodiment, according to the foldable display panel provided by the embodiment of the present disclosure, in order to realize a protective effect of the ultrathin glass cover window 02 on the display module 01, as shown in FIG. 1, the arc length L2 of the edge C2, which is bent to the side facing away from the light emitting surface of the display module 01, of the ultrathin glass cover window 02 is larger than the arc length L1 of the edge C1, which is bent to the side facing away from the light emitting surface of the display module 01, of the display module 01. As an example, the difference of L2 and L1 may be larger than or equal to 0.2 mm and smaller than or equal to 0.5 mm.

In one embodiment, according to the foldable display panel provided by the embodiment of the present disclosure, the elasticity modulus of the bent edge C2 of the ultrathin glass cover window 02 is larger than the elasticity modulus of the second foldable part A2 and the elasticity modulus of the second flat parts B2. In some embodiments, the elasticity modulus of the bent edge C2 of the ultrathin glass cover window 02 is larger than or equal to 70 Gpa and smaller than or equal to 75 Gpa (e.g., 72 Gpa), and the hardness value of the bent edge C2 of the ultrathin glass cover window 02 is larger than or equal to 7 H.

It should be understood that from the macroscopic perspective, elasticity modulus is a scale that measures the ability of an object to resist elastic deformation. From the microscopic perspective, it reflects the bond strength between atoms, ions or molecules. When the edge C2 of the ultrathin glass cover window 02 is bent and shaped, the edge C2 of the ultrathin glass cover window 02 bears tensile stress and compression stress, and the second foldable part A2 and the second flat parts B2 of the ultrathin glass cover window 02 mainly bear the tensile stress. By designing a large elasticity modulus for the edge C2 of the ultrathin glass cover window 02, the edge C2 of the ultrathin glass cover window 02 can have good stress absorption capacity and impact resistance, so that warping and deformation do not take place easily. Therefore, the problem of peeling does not take place between the edge C2 of the ultrathin glass cover window 02 and the edge C1 of the display module 01.

In specific implementation, after ordinary glass is processed to ultrathin glass, the edge of the ultrathin glass is treated with bending (such as hot bending) and hardening (such as changing of the composition structure or adjustment of the element ratio), so that the ultrathin glass cover window 02 with the bent edge is formed. In addition, after above treatment, the elasticity modulus of the edge C2 of the ultrathin glass cover window 02 is larger than the elasticity modulus of other areas (namely the second foldable part A2 and the second flat parts B2).

In one embodiment, according to the foldable display panel provided by the embodiment of the present disclosure, in order to make the overall bending performance and hardness of the ultrathin glass cover window 02 uniform and proper, the thickness of the second foldable part A2, the thickness of the second flat parts B2 and the thickness of the bent edge C2 of the ultrathin glass cover window 02 are equal in the direction perpendicular to the light emitting surface of the display module.

It can be easily understood that the thicker the ultrathin glass cover window 02 is, the higher its rigidity and impact resistance will be, but its bending performance and flatness can be influenced to a certain extent; the smaller the thickness is, the better its bending performance and flatness will be, but its hardness and impact resistance can be reduced. In addition, in order to facilitate interior space design of products such as mobile phone terminals, the thickness of the ultrathin glass cover window 02 tends to be thinner, but the abovementioned hardness, flatness and impact resistance must also be met. Preferentially, according to the display module provided by the embodiments of the disclosure, the thickness of the ultrathin glass cover window 02 ranges from 30 μm to 70 μm in the direction perpendicular to the light emitting surface of the display module, so that the ultrathin glass cover window 02 has good bending performance, enough hardness and reliable impact resistance besides the ultrathin structure.

In one embodiment, according to the foldable display panel provided by the embodiment of the present disclosure, in order to make the ultrathin glass cover window 02 have good bending performance, hardness and impact resistance, the reinforcement depth of the ultrathin glass cover window 02 should be larger than or equal to 6 μm and the reinforcement compressive stress should be larger than or equal to 450 MPa. As an example, the reinforcement depth of the ultrathin glass cover window 02 with a thickness of 30 μm is larger than or equal to 6 μm, and the reinforcement compressive stress of the ultrathin glass cover window 02 with the thickness of 30 μm is larger than or equal to 450 MPa; the reinforcement depth of the ultrathin glass cover window 02 with a thickness of 50 μm is larger than or equal to 7 μm, and the reinforcement compressive stress of the ultrathin glass cover window 02 with the thickness of 50 μm is larger than or equal to 500 MPa; and the reinforcement depth of the thick ultrathin glass cover window 02 with a thickness of 70 μm is larger than or equal to 9 μm, and the reinforcement compressive stress of the thick ultrathin glass cover window 02 with a thickness of 70 μm is larger than or equal to 550 MPa.

In one embodiment, the foldable display panel provided by the embodiment of the disclosure, as shown in FIG. 1, further includes: a bracket 04 located on the side, facing away from the ultrathin glass cover window 02, of the display module 01. The shape of the bracket 04 is the same or roughly same as the shape of the display module 01, so that the display module 01 can be effectively supported and protected. In some embodiments, in order to completely protect the display module 01, an orthographic projection of the bracket 04 on the light emitting surface of the display module 01 completely covers the display module 01. In one embodiment, the bracket 04 may be expanded outwards by a range from 0.2 mm to 0.5 mm, such as 0.2 mm, 0.3 mm, 0.4 mm and 0.5 mm relative to the display module 01. Optionally, the bracket 04 may be made of materials such as stainless steel (e.g., SUS, Patten-SUS) or titanium alloy. In order to realize good supporting effects, the bent edge of the bracket 04 can be thickened relative to other areas; or the bent edge of the bracket 04 may be configured to be of a double-layer structure, and a single-layer structure is configured for other areas. In addition, as shown in FIG. 4, the bracket 04 and the display module 01 may be fixed by a second binding layer 05, such as an Optically Clear Adhesive (OCA) layer or a FOAM adhesive layer, etc.

As shown in the above description, the display module 01 is sandwiched between the ultrathin glass cover window 02 and the bracket 04. These three parts form a sandwiching structure, and edges of them are arc faces with the same curvature, so that a new pattern foldable product with a 3D curved surface structure which is different from planar foldable products in the related art is realized. In addition, the problem of obvious folds and creases at folded positions is solved.

In another aspect, an embodiment of the present disclosure further provides a foldable display device, as shown in FIG. 2 and FIG. 3, including: a shell 06, a foldable display panel fixed on the shell 06 and a rotation shaft 07 in hinged connection to the shell 06.

The foldable display panel is the above-mentioned foldable display panel.

The rotation shaft 07 is configured to drive the shell 06 and the foldable display panel to get bent or unfolded together.

Principles of problem solution of the foldable display device are similar as those of the foldable display panel, so that the display device provided by the embodiments of the disclosure can be implemented with reference to implementation of the foldable display panel provided by the embodiments of the disclosure, while repeated contents are omitted here. In addition, the foldable display device may be: a mobile phone, a tablet PC, a TV set, a display, a laptop, a digital photo frame, a navigation instrument, an intelligent watch, a fitness wristband, a personal digital assistant and any other product or component with a display function. Those generally skilled in the art should understand that the foldable display device includes other essential components, which will not be described in details here and should not bring any restriction on the present disclosure.

Figure 5:
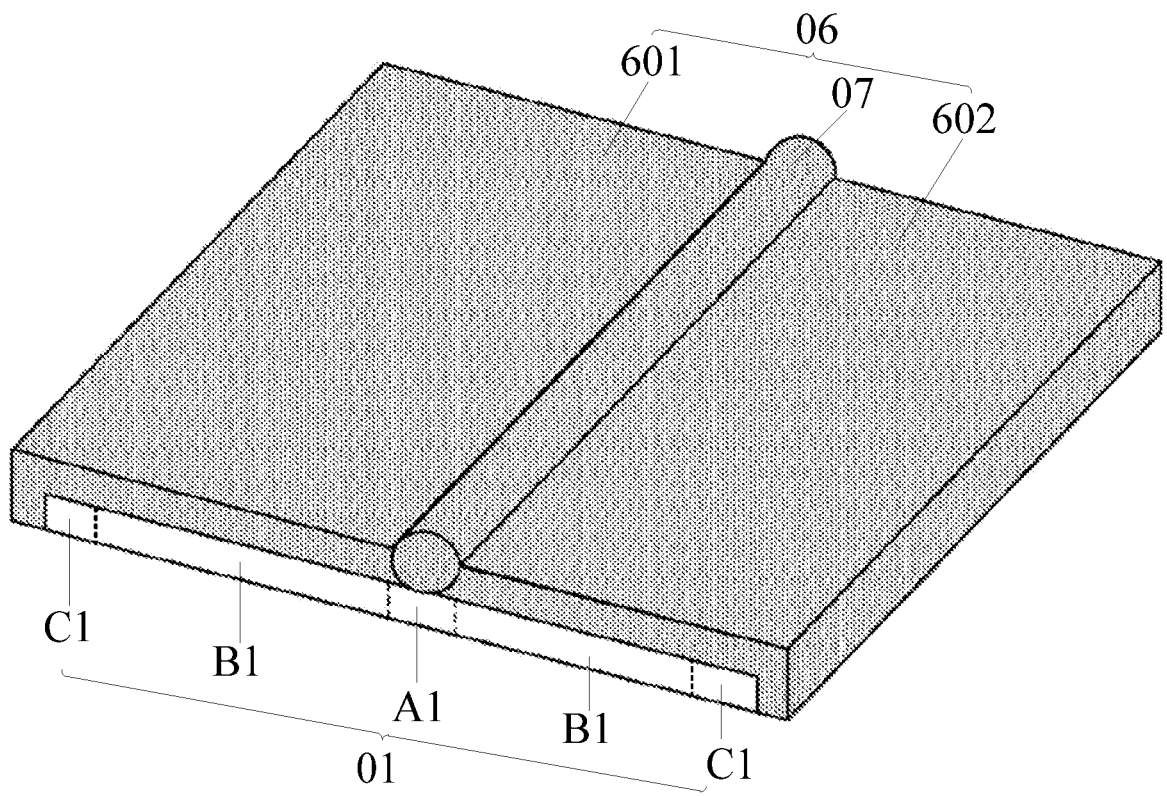
FIG. 5 is another schematic structural diagram of the foldable display device according to the embodiments of the present disclosure.

In one embodiment, in the foldable display device provided by the embodiment of the present disclosure, as shown in FIG. 5, the shell 06 includes: a first shell body 601 and a second shell body 602. The first shell body 601 and the second shell body 602 are in rotatable connection by the rotation shaft 07. Optionally, a first foldable part A1 may corresponds to an area between the first shell body 601 and the second shell body 602, first flat parts B1 and bent edges C1 on both sides of the first foldable part A1 are accommodated in the first shell body 601 and the second shell body 602 respectively, so that the first shell body 601 encloses the first flat part B1 and the bent edge C1 on the left side of the first foldable part A1, and the second shell body 602 encloses the first flat part B1 and the bent edge C1 on the right side of the first foldable part A1.

In one embodiment, according to the foldable display device provided by the embodiment of the present disclosure, in order to facilitate realization of a folding function, an orthographic projection of the rotation shaft 07 on a light emitting surface of a display module 01 coincides with a bending axis of the first foldable part A1.

The bending lengths of both an ultrathin glass cover window 02 and a bracket 04 are larger than the bending length of the display module 01 disposed between them, so that a clearance exists between the end face of the bent edge of the display module 01 and the shell 06 when both the end face of the bent edge of the ultrathin glass cover window 02 and the end face of the bent edge of the bracket 04 are in contact with the shell 06. Based on this, in the foldable display device provided by the embodiment of the present disclosure, a binding layer like insulation materials such as foam and dustproof glue can fill the clearance between the shell 06 and the end face of the bent edge of the display module 01, so that the display module 01 can be protected better.

In addition, generally components such as batteries and mainboards may be disposed in a storage space defined by the bracket 04 and the shell 06, which is not defined here.

In another aspect, an embodiment of the present disclosure further provides a manufacture method of the above foldable display panel. Principles of problem solution of the manufacture method are similar as those of the foldable display panel, so that the manufacture method provided by the embodiment of the present disclosure can be implemented with reference to implementation of the foldable display panel provided by the embodiment of the present disclosure, while repeated contents are omitted here.

In one embodiment, the manufacture method of the foldable display panel provided by the embodiment of the present disclosure may include the following steps:

manufacturing a display module, where the display module includes: a first foldable part, and first flat parts located on two sides of the first foldable part;

manufacturing an ultrathin glass cover window, where the ultrathin glass cover window includes: a second foldable part, and second flat parts located on two sides of the second foldable part; and fitting the side of a light emitting surface of the display module to the ultrathin glass cover window, so that an orthographic projection of the second foldable part on the display module covers the first foldable part, and orthographic projections of the second flat parts on the display module cover the first flat parts.

In one embodiment, in the manufacture method provided by the embodiment of the present disclosure, manufacturing the ultrathin glass cover window can be realized by the following steps:

providing planar glass with the thickness of 30 μm to 70 μm; and heating the planar glass under the temperature of 580° C. to 710° C., softening it for shaping in a mold, and then annealing it to obtain the ultrathin glass cover window with bent edges. The ultrathin glass cover window further includes a second foldable part, and second flat parts each located between the second foldable part and the bent edge. Optionally, in the present disclosure, heating time is not defined, and it is only required that effects of heating and softening can be realized. As an example, heating time is short as glass can be softened very quickly when the heating temperature is high; and glass softening time is long when the heating temperature is low.

In one embodiment, in the manufacture method provided by the embodiment of the present disclosure, after the side of the light emitting surface of the display module is fitted to the ultrathin glass cover window, the following steps may be executed:

providing a steel sheet with the thickness larger than or equal to 0.1 mm;

etching the steel sheet, so that the shape of the etched steel sheet is similar to or same as the shape of the planar glass;

stamping and forming for the edge of the etched steel sheet so as to form a bracket with a bent edge, where the curvature of the edge of the bracket is similar to or same as the curvature of the edge of the ultrathin glass cover window, and it is notable that in order to enhance bendability of the bracket, holes may be punched on the bracket before stamping and forming, namely manufacture of a plurality of via holes which penetrate the bracket in the thickness direction; and fitting the bracket to the side facing away from the ultrathin glass cover window, of the display module, where the bracket completely covers the display module.

Here, manufacture of the foldable display panel is completed.

The embodiments of the present disclosure provide the foldable display panel, the manufacture method thereof and the foldable display device. The foldable display panel includes the display module, where the display module includes the first foldable part, and the first flat parts located on two sides of the first foldable part; and the ultrathin glass cover window which is located on the side of a light emitting surface of the display module, where the ultrathin glass cover window includes: a second foldable part, and second flat parts located on two sides of the second foldable part. The orthographic projection of the second foldable part on the display module covers the first foldable part, and the orthographic projections of the second flat parts on the display module cover the first flat parts. In the present disclosure, the ultrathin glass cover glass replaces a PI cover window or a PET cover window in the related art to protect the display module. The ultrathin glass cover window not only has a rigid characteristic of a glass material, but also has a certain bending property, so that the foldable display panel has high bending performance and enough hardness. Therefore, creasing caused by folding is relieved to the maximum extent.

Obviously, those skilled in the art can make various alterations and modifications of the embodiments of the disclosure without departing from the spirit and scope of the embodiments of the disclosure. In view of this, if these alterations and modifications of the embodiments of the disclosure fall into the scope of the claims and equivalent art thereof, the disclosure is deemed to have the intent to incorporate these alterations and modifications.

What is claimed is:

1. A foldable display panel, comprising:
a display module, wherein the display module comprises: a first foldable part, first flat parts located on two sides of the first foldable part, and first curved edges located on two sides of the first flat parts away from the first foldable part;
a glass cover window located on a side of a light emitting surface of the display module, wherein the glass cover window comprises: a second foldable part, second flat parts located on two sides of the second foldable part, and second curved edges located on two sides of the second flat parts away from the second foldable part; and
a bracket located on a side, facing away from the glass cover window, of the display module, wherein a shape of the bracket is consistent with a shape of the display module, and the bracket comprises third curved edges corresponding to the first curved edges;
wherein an orthographic projection of the second foldable part on the display module covers the first foldable part, orthographic projections of the second flat parts on the display module cover the first flat parts, and orthographic projections of the second curved edges on the display module cover the first curved edges;
in an unfolded state of the foldable display panel, the first curved edges of the display module, the second-curved edges of the glass cover window, and the third curved edges of the bracket are bent towards a side facing away from the light emitting surface of the display module, and planes where an end face of each of the first curved edges, an end face of each of the second curved edges, and an end face of each the third curved edges are located are substantially parallel to the light emitting surface; and
a distance between the end faces of each of the second curved edges and the light emitting surface is larger than a distance between the end face of each of the first curved edges and the light emitting surface, and the distance between the end face of each of the second curved edges and the light emitting surface substantially equals to a distance between the end face of each of the third curved edges and the light emitting surface.

2. The foldable display panel of claim 1, wherein elasticity modulus of the second curved edges of the glass cover window is larger than elasticity modulus of the second foldable part and elasticity modulus of the second flat parts; and the elasticity modulus of the second curved edges of the glass cover window is larger than or equal to 70 Gpa and smaller than or equal to 75 Gpa.

3. The foldable display panel of claim 1, wherein a hardness value of the second curved edges of the glass cover window is larger than or equal to 7 H.

4. The foldable display panel of claim 1, wherein in a direction perpendicular to the light emitting surface of the display module, a thickness of the second foldable part, a thickness of the second flat parts and a thickness of the second curved edges of the glass cover window are equal; and a thickness of the glass cover window ranges from 30 µm to 70 µm.

5. The foldable display panel of claim 4, wherein a reinforcement depth of the glass cover window is larger than or equal to 6 µm, and reinforcement compressive stress of the glass cover window is larger than or equal to 450 MPa.

6. The foldable display panel of claim 1, wherein a radian of the first curved edges of the display module is larger than 0° and smaller than 90°, or equal to 90°.

7. The foldable display panel of claim 1, wherein under a bent state of the foldable display panel, radians of the first foldable part and the second foldable part are larger than 0° and smaller than 180°, or equal to 180°.

8. The foldable display panel of claim 1, wherein an orthographic projection of the bracket on the light emitting surface of the display module completely covers the display module.

9. The foldable display panel of claim 8, wherein the orthographic projection of the bracket on the light emitting surface of the display module is outwards expanded by 0.2 mm to 0.5 mm relative to the display module.

10. A foldable display device, comprising: a shell, the foldable display panel of claim 1 fixed on the shell, and a rotation shaft in hinged connection with the shell, wherein the rotation shaft is configured to drive the shell and the foldable display panel to get bent or unfolded together.

11. The foldable display device of claim 10, wherein the shell comprises: a first shell body and a second shell body, and the first shell body and the second shell body are in rotatable connection by the rotation shaft.

12. The foldable display device of claim 11, wherein the first foldable part corresponds to an area between the first shell body and the second shell body, and the first flat parts and the first curved edges of the display module on two sides of the first foldable part are accommodated by the first shell body and the second shell body respectively.

13. The foldable display device of claim 10, wherein an orthographic projection of the rotation shaft on the light emitting surface of the display module coincides with a bending axis of the first foldable part.

14. The foldable display device of claim 10, further comprising: a binding layer between the shell and the end faces of each of the first curved edges of the display module.

15. A manufacture method of the foldable display panel of claim 1, comprising:
manufacturing the display module;
manufacturing the glass cover window; and
fitting a side of the light emitting surface of the display module to the glass cover window, so that the orthographic projection of the second foldable part on the display module covers the first foldable part, the orthographic projections of the second flat parts on the display module cover the first flat parts, and the orthographic projections of the second curved edges on the display module cover the first curved edges.

16. The manufacture method of claim 15, wherein said manufacturing the glass cover window comprises:
providing planar glass with a thickness of 30 µm to 70 µm; and
heating the planar glass under a temperature of 580° C. to 710° C., softening the planar glass for shaping in a mold, and annealing the planar glass to obtain the glass cover window with the second curved edges, wherein the second flat parts each located between the second foldable part and the second curved edges.

17. The manufacture method of claim 16, wherein after the side of the light emitting surface of the display module is fitted to the glass cover window, the method further comprises:
providing a steel sheet with a thickness larger than or equal to 0.1 mm;
etching the steel sheet, so that a shape of the etched steel sheet is similar to a shape of the planar glass;
stamping and forming for edges of the etched steel sheet so as to form the bracket with third curved edges, wherein a curvature of the third curved edges of the bracket is similar to a curvature of the second curved edges of the glass cover window; and
fitting the bracket to a side, facing away from the glass cover window, of the display module, wherein the bracket completely covers the display module.

* * * * *